(12) United States Patent
Ryu

(10) Patent No.: US 12,193,304 B2
(45) Date of Patent: Jan. 7, 2025

(54) LIGHT EMITTING DISPLAY DEVICE HAVING A TRENCH BETWEEN PIXELS

(71) Applicant: LG DISPLAY CO., LTD., Seoul (KR)

(72) Inventor: Jiho Ryu, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 18/237,212

(22) Filed: Aug. 23, 2023

(65) Prior Publication Data

US 2023/0403901 A1 Dec. 14, 2023

Related U.S. Application Data

(63) Continuation of application No. 17/137,861, filed on Dec. 30, 2020, now Pat. No. 11,778,881.

(30) Foreign Application Priority Data

Dec. 31, 2019 (KR) .......................... 10-2019-0180113

(51) Int. Cl.
  *H10K 59/35* (2023.01)
  *H10K 50/84* (2023.01)
  *H10K 50/858* (2023.01)

(52) U.S. Cl.
  CPC ........... *H10K 59/353* (2023.02); *H10K 50/84* (2023.02); *H10K 50/858* (2023.02)

(58) Field of Classification Search
  CPC ..... H10K 59/353; H10K 50/84; H10K 50/858
  USPC ............................................................ 257/40
  See application file for complete search history.

(56) References Cited

U.S. PATENT DOCUMENTS

| 10,680,045 B2 | 6/2020 | Baik et al. |
| 2014/0197417 A1 | 7/2014 | Nanai et al. |
| 2016/0013438 A1* | 1/2016 | Im ...................... H10K 59/1315 257/762 |
| 2019/0237704 A1 | 8/2019 | Moon et al. |
| 2019/0379006 A1* | 12/2019 | Lim ........................ G06F 1/163 |
| 2020/0096676 A1 | 3/2020 | Ha et al. |
| 2020/0251541 A1 | 8/2020 | Kim et al. |

FOREIGN PATENT DOCUMENTS

| KR | 10-2007-0051636 A | 5/2007 |
| KR | 10-2019-0018922 A | 2/2019 |
| KR | 10-2019-0068814 A | 6/2019 |
| KR | 10-2019-0140348 A | 12/2019 |

* cited by examiner

*Primary Examiner* — Xia L Cross
(74) *Attorney, Agent, or Firm* — POLSINELLI PC

(57) ABSTRACT

A display device comprises a substrate in which a first subpixel and a second subpixel arranged to adjoin the first subpixel are defined, a first electrode provided in each of the first subpixel and the second subpixel on the substrate, a light emitting layer provided in each of the first subpixel and the second subpixel on the first electrode, a second electrode commonly provided in the first subpixel and the second subpixel on the light emitting layer, a trench portion provided between the first subpixel and the second subpixel, and an insulating portion filling at least a part of the trench portion.

17 Claims, 14 Drawing Sheets

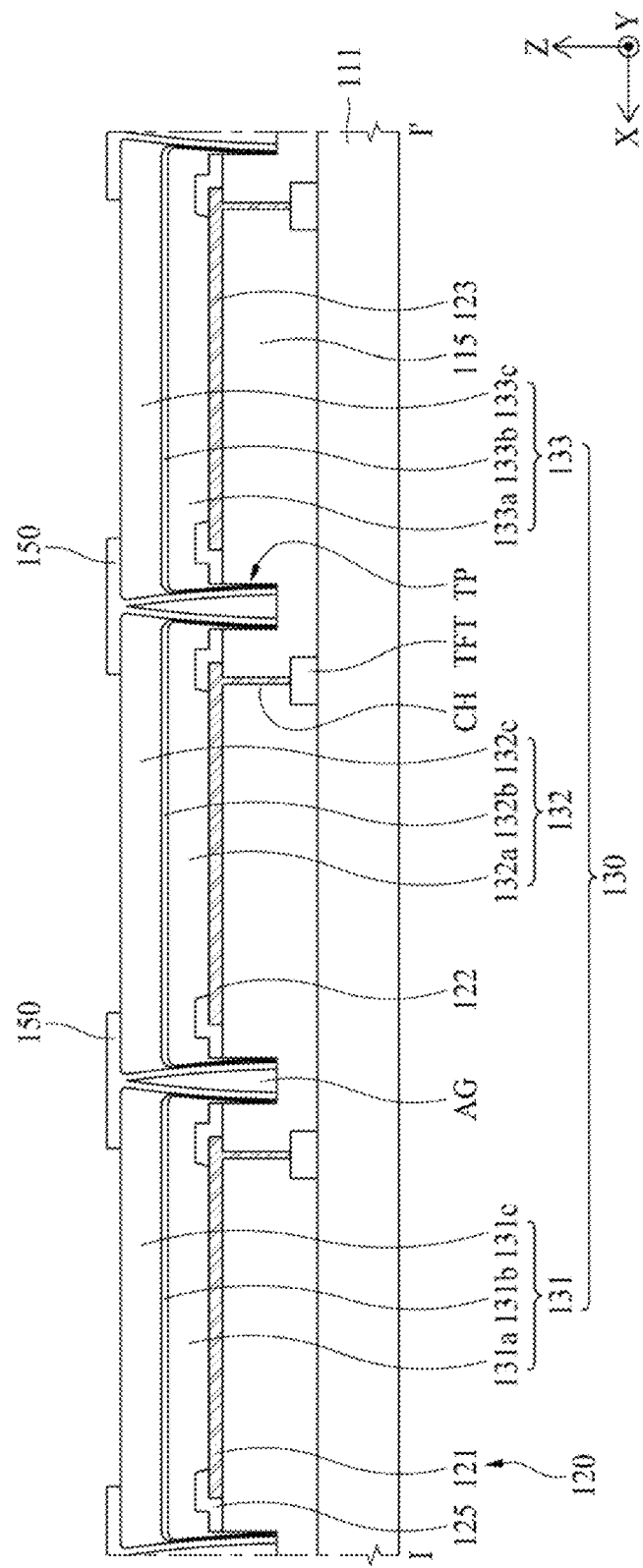

LIGHT EMITTING DISPLAY DEVICE HAVING A TRENCH BETWEEN PIXELS

CROSS-REFERENCE TO RELATED APPLICATIONS

This application is a continuation of U.S. patent application Ser. No. 17/137,861, filed on Dec. 30, 2020, which claims the benefit of the Korean Patent Application No. 10-2019-0180113 filed on Dec. 31, 2019, which are hereby incorporated by reference in their entirety.

BACKGROUND

Field of the Disclosure

The present disclosure relates to a display device displaying an image.

Description of the Background

With the advancement of the information age, the demand for a display device for displaying an image has increased with various forms. Therefore, various types of display devices such as a liquid crystal display (LCD) device and a plasma display panel (PDP) device, a quantum dot light emitting display (QLED) device and an organic light emitting display (OLED) device have been recently used.

Among the display devices, the organic light emitting display device is a self-light emitting device, and has advantages in that a viewing angle and a contrast ratio are more excellent than those of the liquid crystal display (LCD) device. Also, since the organic light emitting display device does not require a separate backlight, it is advantageous that the organic light emitting display device is able to be thin and lightweight and has low power consumption. Furthermore, the organic light emitting display device has advantages in that it may be driven at a low direct current voltage, has a fast response speed, and especially has a low manufacturing cost.

Recently, a head mounted display (HMD) including such an organic light emitting display device has been developed. The head mounted display (HMD) is a glasses type monitor device of virtual reality (VR) or augmented reality (AR), which forms a focal point on a close distance in front of eyes of a user who wears the HMD in glasses or helmet type. However, in a head mounted display of ultra-high resolution, since an interval between pixels is narrow, adjacent pixels may be affected by a leakage current remarkably.

SUMMARY

The present disclosure has been made in view of the above problems, and the present disclosure provides a display device that may prevent a leakage current from being generated between adjacent pixels.

The present disclosure also provides a display device that may prevent a short from being generated between a second electrode and a charge generation layer.

In addition to the present disclosure as mentioned above, additional features of the present disclosure will be clearly understood by those skilled in the art from the following description of the present disclosure.

In accordance with an aspect of the present disclosure, the above and other features can be accomplished by the provision of a display device comprising a substrate in which a first subpixel and a second subpixel arranged to adjoin the first subpixel are defined, a first electrode provided in each of the first subpixel and the second subpixel on the substrate, a light emitting layer provided in each of the first subpixel and the second subpixel on the first electrode, a second electrode commonly provided in the first subpixel and the second subpixel on the light emitting layer, a trench portion provided between the first subpixel and the second subpixel, and an insulating portion filling at least a portion of the trench portion.

According to the present disclosure, a trench is formed between subpixels, whereby a light emitting layer may be disconnected between the subpixels. Also, since a charge generation layer formed in each of the adjacent subpixels is spaced apart from another charge generation layer, a current may be prevented from leaking toward the adjacent subpixels through the charge generation layer.

Also, the display device of the present disclosure comprises an insulating portion that may electrically insulate light emitting layers of adjacent subpixels from each other, whereby a current may more stably be prevented from leaking between the adjacent subpixels.

In addition to the effects of the present disclosure as mentioned above, additional features of the present disclosure will be clearly understood by those skilled in the art from the following description of the present disclosure.

BRIEF DESCRIPTION OF THE DRAWINGS

The above and other features and other advantages of the present disclosure will be more clearly understood from the following detailed description taken in conjunction with the accompanying drawings, in which:

FIGS. 6A to 6F are cross-sectional views illustrating a manufacturing method of a display device according to one aspect of the present disclosure;

DETAILED DESCRIPTION

Figure 1:
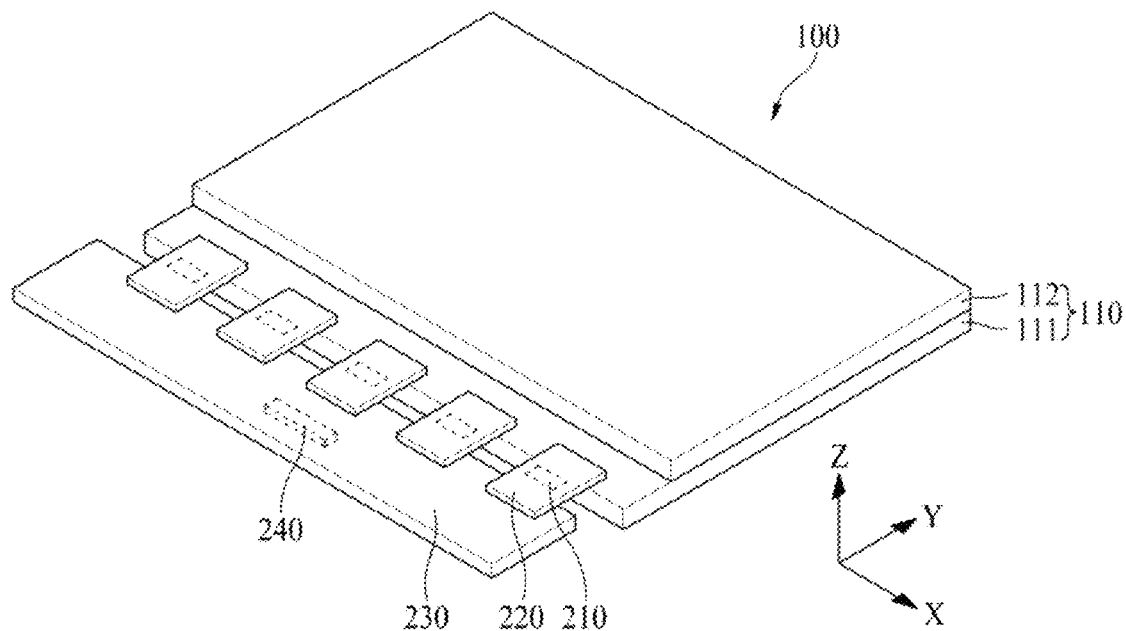
FIG. 1 is a perspective view illustrating a display device according to one aspect of the present disclosure.

Advantages and features of the present disclosure, and implementation methods thereof will be clarified through following aspects described with reference to the accompanying drawings. The present disclosure may, however, be embodied in different forms and should not be construed as limited to the aspects set forth herein. Rather, these aspects are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing aspects of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted. In a case where 'comprise,' 'have,' and 'include' described in the present specification are used, another part may be added unless 'only~' is used. The terms of a singular form may include plural forms unless referred to the contrary.

In the case in which "comprise", "have", and "include" described in the present specification are used, another part may also be present unless "only" is used. The terms in a singular form may include plural forms unless noted to the contrary.

In construing an element, the element is construed as including an error range although there is no explicit description.

In describing a position relationship, for example, when the position relationship is described as 'upon~,' 'above~,' 'below~,' and 'next to~,' one or more portions may be arranged between two other portions unless 'just' or 'direct' is used.

In describing a temporal relationship, for example, when the temporal order is described as "after", "subsequent", "next", and "before", a case which is not continuous may be included, unless "just" or "direct" is used.

It will be understood that, although the terms "first", "second", etc. may be used herein to describe various elements, these elements should not be limited by these terms. These terms are only used to partition one element from another. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in co-dependent relationship.

Hereinafter, a display device according to the present disclosure will be described in detail with reference to the accompanying drawings. Wherever possible, the same reference numbers will be used throughout the drawings to refer to the same or like parts. Since a scale of each of elements shown in the accompanying drawings is different from an actual scale for convenience of description, the present disclosure is not limited to the shown scale.

FIG. 1 is a perspective view illustrating a display device according to one aspect of the present disclosure.

Referring to FIG. 1, the display device 100 according to one aspect of the present disclosure comprises a display panel 110, a source driver integrated circuit (IC) 210, a flexible film 220, a circuit board 230, and a timing controller 240.

The display panel 110 includes a first substrate 111 and a second substrate 112. The second substrate 112 may be an encapsulation substrate. The first substrate 111 may be a plastic film or a glass substrate. The second substrate 112 may be a plastic film, a glass substrate, or an encapsulation film.

Gate lines, data lines, and pixels are formed on one surface of the first substrate 111 facing the second substrate 112. The pixels are provided in an area defined by an intersection structure of the gate lines and the data lines.

Each of the pixels may include a light emitting diode that includes a thin film transistor, a first electrode, a light emitting layer, and a second electrode. Each of the pixels supplies a predetermined current to the light emitting diode in accordance with a data voltage of the data line when a gate signal from the gate line is input thereto using a thin film transistor. For this reason, the light emitting diode of each of the pixels may emit light with a predetermined brightness in accordance with the predetermined current. A structure of each of the pixels will be described later with reference to FIGS. 3 and 4.

The display panel 110 may be divided into a display area where pixels are formed to display an image, and a non-display area that does not display an image. The gate lines, the data lines, and the pixels may be formed in the display area. A gate driver and pads may be formed in the non-display area.

The gate driver supplies gate signals to the gate lines in accordance with a gate control signal input from the timing controller 240. The gate driver may be formed in the non-display area outside one side or both sides of the display area of the display panel 110 in a gate driver-in-panel (GIP) type. Alternatively, the gate driver may be manufactured as a driving chip, may be packaged in a flexible film, and may be attached to the non-display area outside one side or both sides of the display area of the display panel 110 in a tape automated bonding (TAB) type.

The source driver IC 210 receives digital video data and a source control signal from the timing controller 240. The source driver IC 210 converts the digital video data into analog data voltages in accordance with the source control signal, and supplies the analog data voltages to the data lines. If the source driver IC 210 is manufactured as a driving chip, the source driver IC 210 may be packaged in the flexible film 220 in a chip-on-film (COF) type or a chip-on-plastic (COP) type.

Pads, such as data pads, may be formed in the non-display area of the display panel 110. Lines connecting the pads with the source driver IC 210 and lines connecting the pads with lines of the circuit board 230 may be formed in the flexible film 220. The flexible film 220 may be attached onto the pads using an anisotropic conducting film, whereby the pads may be connected with the lines of the flexible film 220.

The circuit board 230 may be attached onto the flexible films 220. A plurality of circuits embodied as driving chips may be packaged in the circuit board 230. For example, the timing controller 240 may be packaged in the circuit board 230. The circuit board 230 may be a printed circuit board or a flexible printed circuit board.

The timing controller 240 receives the digital video data and a timing signal from an external system board through a cable of the circuit board 230. The timing controller 240 generates a gate control signal for controlling an operation timing of the gate driver and a source control signal for controlling the source driver ICs 210 based on the timing signal. The timing controller 240 supplies the gate control signal to the gate driver, and supplies the source control signal to the source driver ICs 210.

Figure 2:
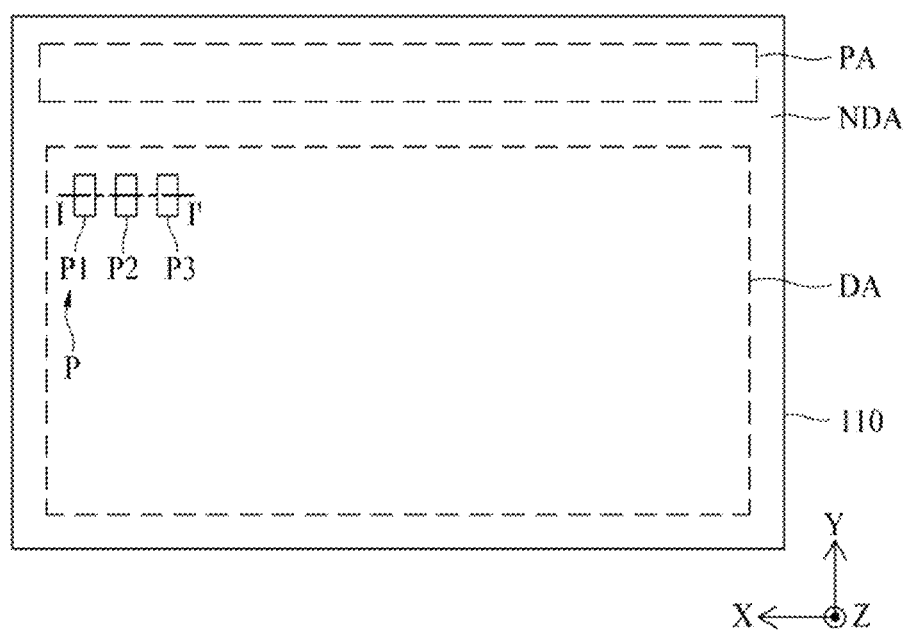
FIG. 2 is a plan view illustrating a display device according to one aspect of the present disclosure.
Figure 3:
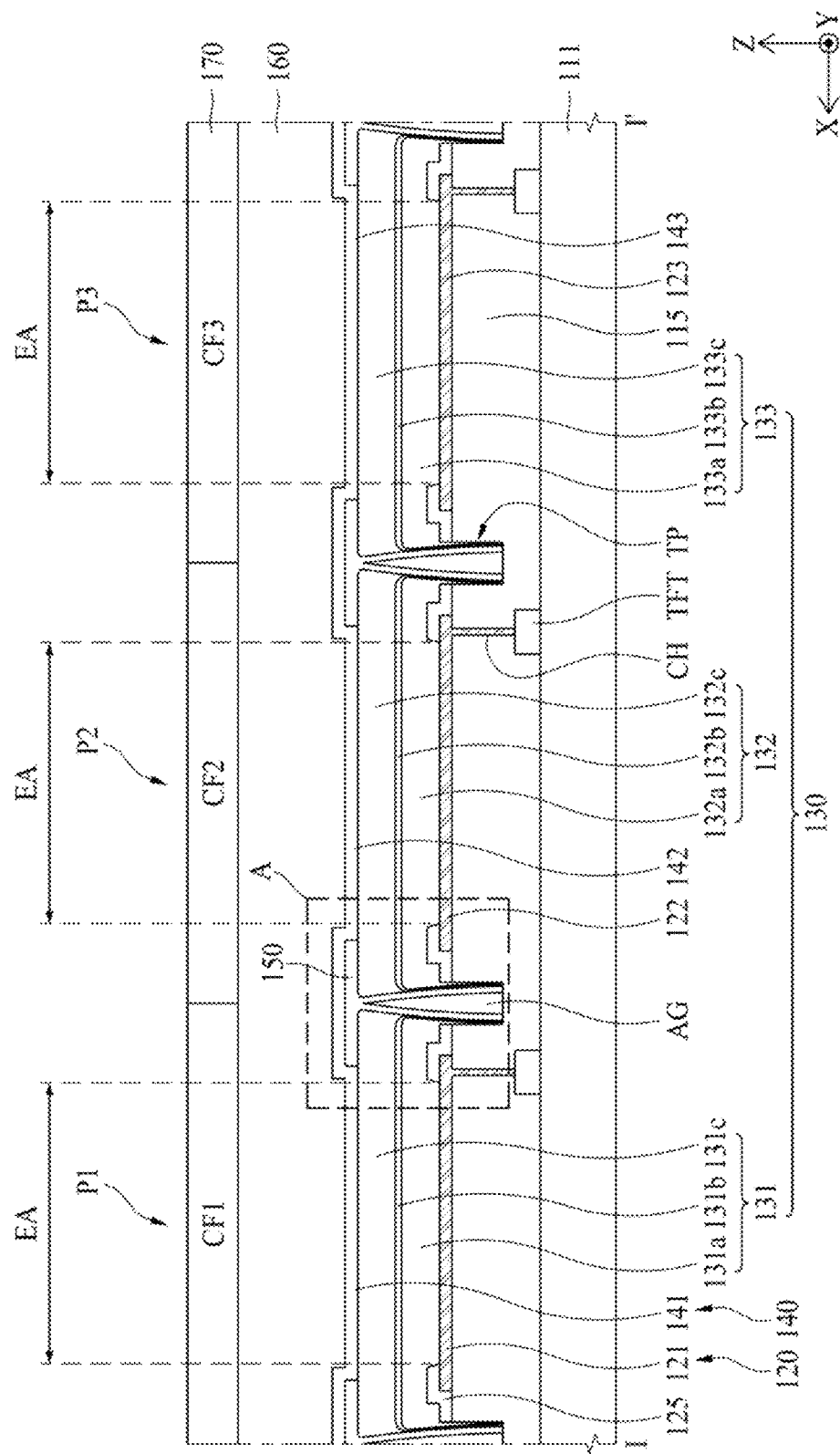
FIG. 3 is a cross-sectional view illustrating an example taken along line I-I' of FIG. 2.
Figure 4:
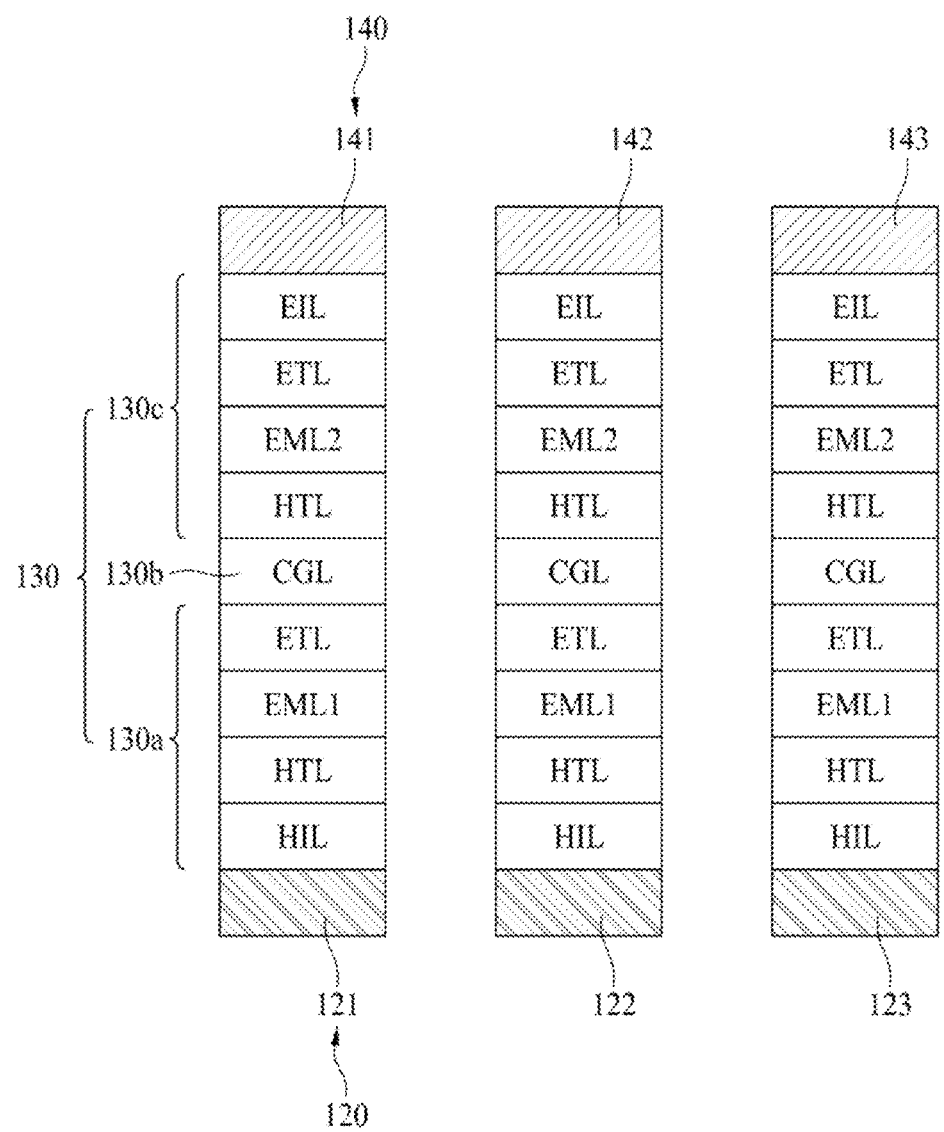
FIG. 4 is a detailed cross-sectional view illustrating an example of a light emitting diode of a display device according to one aspect of the present disclosure.
Figure 5:
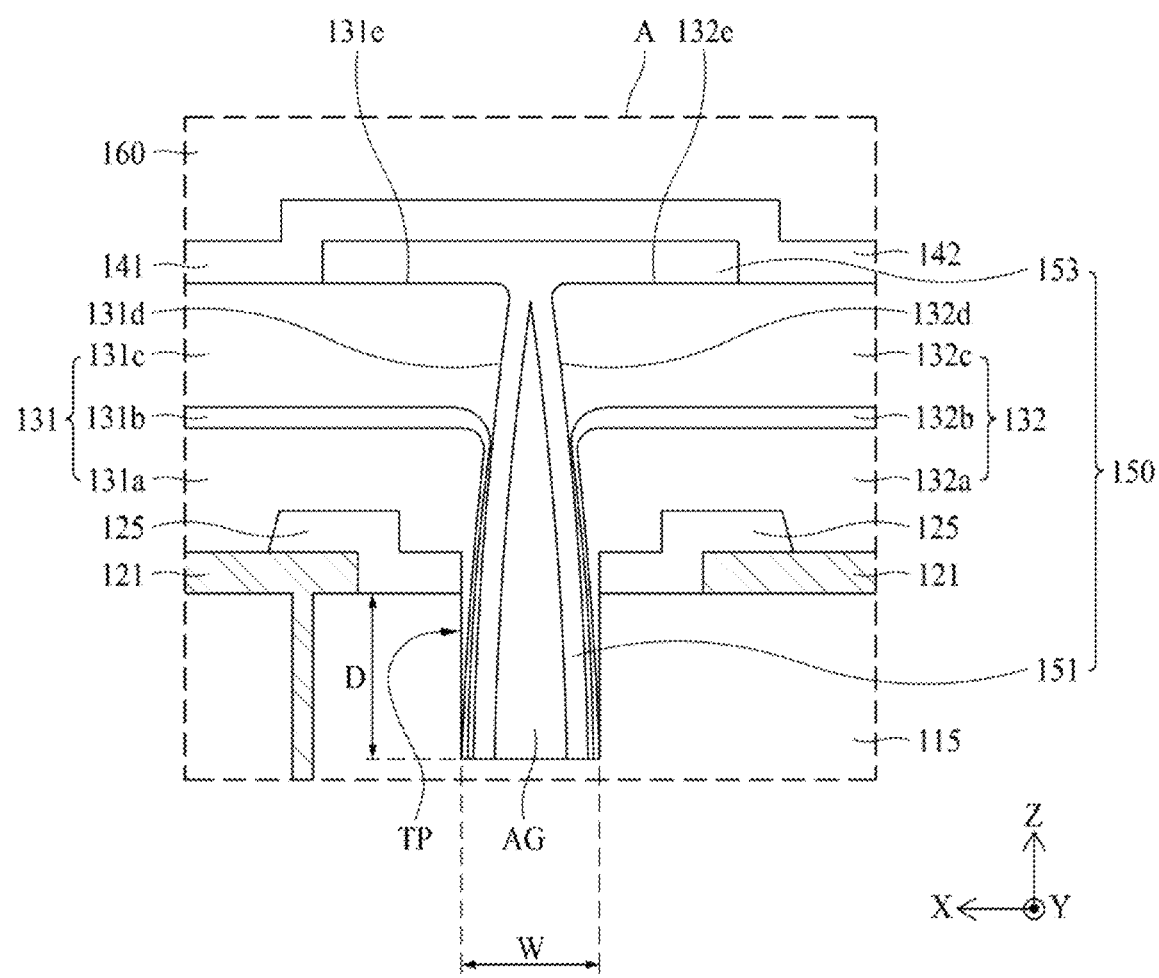
FIG. 5 is an enlarged view illustrating area A of FIG. 3.

FIG. 2 is a plane view illustrating a display device according to one aspect of the present disclosure, FIG. 3 is a cross-sectional view illustrating an example taken along line I-I' of FIG. 2, FIG. 4 is a detailed cross-sectional view illustrating an example of a light emitting diode of a display device according to one aspect of the present disclosure, and FIG. 5 is an enlarged view illustrating an area A of FIG. 3.

Referring to FIGS. 2 to 5, the first substrate 111 is categorized into a display area DA and a non-display area NDA, and a pad area PA where pads are formed may be formed in the non-display area NDA.

Data lines and gate lines crossing the data lines are formed in the display area DA. Also, pixels P for displaying an image in the form of matrix may be formed in an intersection area of the data lines and the gate lines.

Each of the pixels P may include a first subpixel P1, a second subpixel P2, and a third subpixel P3. The first subpixel P1 may be provided to emit red light, the second subpixel P2 may be provided to emit green light, and the third subpixel P3 may be provided to emit blue light, but these subpixels are not limited to this example. Each of the pixels may further include a fourth subpixel for emitting white (W) light. Also, an arrangement sequence of the subpixel P1, P2 and P3 may be changed in various ways. Although FIG. 2 shows that the pixel P has a rectangular shape in which the subpixels P1, P2 and P3 are arranged in one line, the aspect of the present disclosure is not limited to the example of FIG. 2, and the pixel P may have a square shape, a circular shape, an oval shape and an unfixed shape.

Each of the subpixels P1, P2 and P3 supplies a predetermined current to the light emitting diode in accordance with the data voltage of the data line if the gate signal of the gate line is input thereto. For this reason, the light emitting diode of each of the pixels P1, P2 and P3 may emit light with a predetermined brightness in accordance with a predetermined current.

A thin film transistor TFT, a passivation layer 115, a bank 125, a first electrode 120, a light emitting layer 130, a second electrode 140, an insulating portion 150, an encapsulation portion 160, a color filter 170 and a trench portion TP are formed on one surface of the first substrate 111, and an air gap AG overlapped with the trench portion TP is formed thereon.

The first substrate 111 is a base substrate of the display device, and may be made of, but not limited to, glass or plastic. The first substrate 111 may be made of a semiconductor material such as a silicon wafer. The first substrate 111 may be made of a transparent material or an opaque material.

If the display device 100 according to one aspect of the present disclosure is provided in a top emission type in which light is emitted to a top portion, an opaque material as well as a transparent material may be used as the first substrate 111. If the display device is provided in a bottom emission type in which light is emitted to a bottom portion, a transparent material may be used as the first substrate 111.

A circuit diode which includes various signal lines, a thin film transistor and a capacitor is provided on the first substrate 111 for each of the subpixels P1, P2 and P3. The signal lines may include a gate line, a data line, a power line, and a reference line. The thin film transistor may include a switching thin film transistor, a driving thin film transistor TFT and a sensing thin film transistor.

The switching thin film transistor is switched in accordance with the gate signal supplied to the gate line, and serves to supply the data voltage supplied from the data line to the driving thin film transistor.

The driving thin film transistor TFT is switched in accordance with the data voltage supplied from the switching thin film transistor to generate a data current from a power source supplied from the power line and serves to supply the generated data current to the first electrode 120.

The sensing thin film transistor serves to sense a threshold voltage deviation of the driving thin film transistor, which is a cause of image degradation, and supplies the current of the driving thin film transistor to the reference line in response to a sensing control signal supplied from the gate line or separate sensing line.

The capacitor serves to maintain the data voltage supplied from the driving thin film transistor TFT for one frame, and is connected to each of a gate terminal and a source terminal of the driving thin film transistor TFT.

The passivation layer 115 is formed on the circuit diode that includes the driving thin film transistor TFT. The passivation layer 115 may be formed of an inorganic film, for example, a silicon oxide (SiOx) film, a silicon nitride (SiNx) film, or a multi-layered film of SiOx and SiNx. The passivation layer 115 may be formed of an organic film such as acryl resin, epoxy resin, phenolic resin, polyamide resin, and polyimide resin. Alternatively, the passivation layer 115 may be formed of a multi-layered film that includes at least one inorganic film and at least one organic film.

The first electrode 120 is formed to be patterned on the passivation layer 115 for each of the subpixels P1, P2 and P3. One first electrode 121 is formed on the first subpixel P1, another first electrode 122 is formed on the second subpixel P2, and the other first electrode 123 is formed on the third subpixel P3.

The first electrodes 121, 122 and 123 are connected to the driving thin film transistor TFT. In detail, the first electrodes 121, 122 and 123 are connected to the source terminal or the drain terminal of the driving thin film transistor TFT through a contact hole CH that passes through the passivation layer 115, whereby a signal from the driving thin film transistor TFT may be applied to the first electrodes 121, 122 and 123.

The first electrodes 121, 122 and 123 may be formed of a transparent metal material, a semi-transmissive metal material, or a metal material with high reflectivity. If the display device 100 is provided in a top emission type, the first electrodes 121, 122 and 123 may be formed of a metal material with high reflectivity such as a deposited structure (Ti/Al/Ti) of Al and Ti, a deposited structure (ITO/Al/ITO) of Al and ITO, an Ag alloy, and a deposited structure (ITO/Ag alloy/ITO) of Ag alloy and ITO. The Ag alloy may be an alloy of Ag, Pd and Cu. If the display device 100 is provided in a bottom emission type, the first electrodes 121, 122 and 123 may be formed of a transparent conductive material (TCO) such as ITO and IZO, which may transmit light, or a semi-transmissive conductive material such as Mg, Ag, or an alloy of Mg and Ag. In this case, the first electrodes 121, 122 and 123 may be referred to as anode electrodes.

The trench portion TP may be formed by partially removing the passivation layer 115. As shown in FIG. 3, the trench portion TP may be arranged among the subpixels P1, P2 and P3.

In the present disclosure, as the trench portion TP is formed among the pixels P1, P2 and P3, a lateral leakage current may be prevented from occurring among the subpixels P1, P2 and P3 adjacent to one another.

The display device 100 according to one aspect of the present disclosure may comprise a light emitting diode provided with a tandem structure of two stacks or more in which two or more light layers are deposited.

The first, second and third subpixels P1, P2 and P3 emitting light of different colors may be arranged to adjoin one another in a first direction (X-axis direction). The subpixels emitting light of the same color may be arranged to adjoin one another in a second direction (Y-axis direction). The first subpixels P1 emitting light of a first color may be arranged to adjoin one another along the second direction (Y-axis direction). The second subpixels P2 emitting light of a second color may be arranged to adjoin one another along the second direction (Y-axis direction). At this time, the second subpixels P2 may be spaced apart from the first subpixels P1 in the first direction (X-axis direction). The third subpixels P3 emitting light of a third color may be arranged to adjoin one another along the second direction (Y-axis direction). At this time, the third subpixels P3 may be spaced apart from the second subpixels P2 in the first direction (X-axis direction).

At this time, the trench portion TP may be provided between the first subpixel P1 and the second subpixel P2 and formed along the second direction (Y-axis direction) in a line shape. The trench portion TP may be provided between the second subpixel P2 and the third subpixel P3 and formed along the second direction (Y-axis direction) in a line shape. Also, if the first subpixel P1 is arranged to adjoin the third subpixel P3, the trench portion TP may be provided between the third subpixel P3 and the first subpixel P1 and formed along the second direction (Y-axis direction) in a line shape.

The trench portion TP may be formed by partially removing the passivation layer 115 to be recessed but is not limited to this example. For example, the trench portion TP may be formed to pass through the passivation layer 115. In this case, the trench portion TP may be referred to as an opening portion or hole. Also, the trench portion TP may be provided in the form of the substrate 111 of which at least a portion is removed. Hereinafter, the trench portion TP will be described based on the portion where the passivation layer 115 is recessed or through which the passivation layer 115 passes.

The trench portion TP, as shown in FIGS. 3 and 5, may be provided to have a bottom side and a sidewall, but its shape is not limited to the bottom side and the sidewall.

A depth and a width of the trench portion TP may be designed considering a thickness of each of first stacks 131a, 132a and 133a, charge generation layers 131b, 132b and 133b and second stacks 131c, 132c and 133c and a width of a light emission area EA.

In detail, the trench portion TP may be designed to have a width W and a depth H such that the first electrodes 121 and 122, the first stacks 131a and 132a of the light emitting layer 130, the charge generation layers 131b and 132b and the second stacks 131c and 132c may be disconnected between the first subpixel P1 and the second subpixel P2.

However, if the trench portion TP is set to exceed a predetermined width in accordance with a design condition of the display device, the light emitting layers 131 and 132 and the second electrodes 141 and 142, which are formed after the trench portion TP is formed, may be formed such that at least a portion of the light emitting layer 130 and the second electrode 140 may be accommodated in the trench portion TP in an area overlapped with the trench portion TP.

In detail, the second electrodes 141 and 142 may be formed to be recessed in an area overlapped with the trench portion TP. A distance or thickness of the second electrodes 141 and 142 for the first electrodes 121 and 122 and the charge generation layers 131b and 132b may be formed to be locally thin and act as a path of a lateral leakage current. That is, if the second electrodes 141 and 142 are formed to be recessed in the area overlapped with the trench portion TP, a lateral leakage current may occur in the path of the first electrodes 121 and 122 or the charge generation layers 131b and 132b of the subpixel adjacent from the second electrodes 141 and 142.

The bank 125 is formed on the passivation layer 115. The bank 125 is formed to cover ends of the first electrodes 121, 122 and 123 and partially expose each of the first electrodes 121, 122 and 123. Therefore, the bank 125 may prevent light emission efficiency from being deteriorated due to concentration of a electrical current on the ends of the first electrodes 121, 122 and 123. In this case, the bank 125 may be referred to as a fence.

The bank 125, as shown in FIG. 3, may be formed to cover the ends of the first electrodes 121, 122 and 123 respectively formed in the subpixels P1, P2 and P3 and expose the trench portion TP formed among the subpixels P1, P2 and P3, but is not limited to this example.

The bank 125 may define the light emission area EA in each of the subpixels P1, P2 and P3. That is, the bank 125 may not be formed in each of the subpixels P1, P2 and P3, and the area where the first electrode 120 is exposed may be the light emission area EA. On the other hand, the area except for the light emission area EA becomes a non-light emission area.

The bank 125 may be formed of, but not limited to, an inorganic film, for example, a silicon oxide (SiOx) film, a silicon nitride (SiNx) film, or a multi-layered film of SiOx and SiNx. The bank 125 may be formed of an organic film such as acryl resin, epoxy resin, phenolic resin, polyamide resin, and polyimide resin.

The light emitting layer 130 is formed on the first electrodes 121, 122 and 123. The light emitting layer 130, as shown in FIG. 4, includes a first stack 130a emitting light of a first color, a second stack 130c emitting light of a second color, and a charge generation layer (CGL) 130b provided between the first stack 130a and the second stack 130c.

The first stack 61 is provided on the first electrodes 121, 122 and 123. The first stack 130a is disconnected among the subpixels P1, P2 and P3.

In detail, the first stack 130a is disconnected between the first subpixel P1 and the second subpixel P2. For example, the first stack 130a may include, but is not limited to, the first stack 131a formed in the first subpixel P1 and the first stack 132a formed in the second subpixel P2. The first stack 131a formed in the first subpixel P1 and the first stack 132a formed in the second subpixel P2 may partially be formed at the sidewall of the trench portion TP as shown in FIGS. 3 and 5, but may be disconnected from each other due to a step difference of the trench portion TP. The first stack 131a formed in the first subpixel P1 and the first stack 132a formed in the second subpixel P2 are not connected with each other on the trench portion TP.

Also, the first stack 130a is disconnected from the second subpixel P2 and the third subpixel P3. For example, the first stack 130a may include, but is not limited to, the first stack 132a formed in the second subpixel P2 and the first stack 133a formed in the third subpixel P3. At this time, the first stack 132a formed in the second subpixel P2 and the first stack 133a formed in the third subpixel P3 may partially be formed at the sidewall of the trench portion TP as shown in FIGS. 3 and 5, but may be disconnected from each other due to a step difference of the trench portion TP. The first stack 132a formed in the second subpixel P2 and the first stack 133a formed in the third subpixel P3 are not connected with each other on the trench portion TP.

The first stack 130a may be formed of a deposited structure of a hole injecting layer HIL, a hole transporting layer HTL, a first light emitting layer EML1 emitting light of a first color, and an electron transporting layer ETL, which are deposited in due order. The first light emitting layer EML1 may be, but not limited to, at least one of a red light emitting layer emitting red light, a green light emitting layer emitting green light, a blue light emitting layer emitting blue light, and a yellow light emitting layer emitting yellow light.

The charge generation layer 130b is provided on the first stack 130a. The charge generation layer 130b is disconnected among the subpixels P1, P2 and P3.

In detail, the charge generation layer 130b is disconnected between the first subpixel P1 and the second subpixel P2. For example, the charge generation layer 130b may include, but is not limited to, a charge generation layer 131b formed in the first subpixel P1 and a charge generation layer 132b formed in the second subpixel P2. At this time, the charge generation layer 131b formed in the first subpixel P1 and the charge generation layer 132b formed in the second subpixel P2 may partially be formed at the sidewall of the trench portion TP as shown in FIGS. 3 and 5, but may be disconnected from each other due to a step difference of the trench portion TP. The charge generation layer 131b formed in the first subpixel P1 and the charge generation layer 132b formed in the second subpixel P2 are not connected with each other on the trench portion TP.

Also, the charge generation layer 130b is disconnected between the second subpixel P2 and the third subpixel P3. For example, the charge generation layer 130b may include, but is not limited to, a charge generation layer 132b formed in the second subpixel P2 and a charge generation layer 133b formed in the third subpixel P3. At this time, the charge generation layer 132b formed in the second subpixel P2 and the charge generation layer 133b formed in the third subpixel P3 may partially be formed at the sidewall of the trench portion TP as shown in FIGS. 3 and 5, but may be disconnected from each other due to a step difference of the trench portion TP. The charge generation layer 132b formed in the second subpixel P2 and the charge generation layer 133b formed in the third subpixel P3 are not connected with each other on the trench portion TP.

The charge generation layer 130b may be formed of a deposited structure of an N-type charge generation layer for supplying electrons to the first stack 130a and a P-type charge generation layer for supplying holes to the second stack 130c.

The second stack 130c is provided on the charge generation layer 130b. The second stack 130c is disconnected among the subpixels P1, P2 and P3.

In detail, the second stack 130c is disconnected between the first subpixel P1 and the second subpixel P2. For example, the second stack 130c may include, but is not limited to, the second stack 131c formed in the first subpixel P1 and the second stack 132c formed in the second subpixel P2. At this time, the second stack 131c formed in the first subpixel P1 and the second stack 132c formed in the second subpixel P2 may partially be formed at the sidewall of the trench portion TP as shown in FIGS. 3 and 5, but may be disconnected from each other due to a step difference of the trench portion TP. The second stack 131c formed in the first subpixel P1 and the second stack 132c formed in the second subpixel P2 are not connected with each other on the trench portion TP.

Also, the second stack 130c is disconnected from the second subpixel P2 and the third subpixel P3. For example, the second stack 130c may include, but is not limited to, the second stack 132c formed in the second subpixel P2 and the second stack 133c formed in the third subpixel P3. At this time, the second stack 132c formed in the second subpixel P2 and the second stack 133c formed in the third subpixel P3 may partially be formed at the sidewall of the trench portion TP as shown in FIGS. 3 and 5, but may be disconnected from each other due to a step difference of the trench portion TP. The second stack 132c formed in the second subpixel P2 and the second stack 133c formed in the third subpixel P3 are not connected with each other on the trench portion TP.

The second stack 130c may be formed of a deposited structure of a hole transporting layer HTL, a second light emitting layer EML2 emitting light of a second color, a hole transporting layer ETL, and a hole injecting layer HIL, which are deposited in due order. The second light emitting layer EML2 may be, but not limited to, at least one of a red light emitting layer emitting red light, a green light emitting layer emitting green light, a blue light emitting layer emitting blue light, and a yellow light emitting layer emitting yellow light.

However, the second light emitting layer EML2 may emit light of a color different from that of light emitted from the first light emitting layer EML1. For example, the first light emitting layer EML1 may be a blue light emitting layer emitting blue light, and the second light emitting layer EML2 may be a yellow light emitting layer emitting yellow light. For another example, the first light emitting layer EML1 may be a blue light emitting layer emitting blue light, and the second light emitting layer EML2 may be a red light emitting layer emitting red light and a green light emitting layer emitting green light.

Since the charge generation layers 130c of the subpixels P1, P2 and P3 are disconnected from one another in the trench portion TP, it is difficult to move charges through the charge generation layer 130c among the subpixels P1, P2 and P3 adjacent to one another. The light emitting layer 130 according to one aspect of the present disclosure may allow the subpixels P1, P2 and P3 to be affected by a leakage current within a minimum range.

Also, the light emitting layer 130 according to one aspect of the present disclosure may be deposited on the subpixels P1, P2 and P3 without using a separate mask.

The light emitting layers 131, 132 and 133, as mentioned above, may be formed in such a manner that the first stacks 131a, 132a and 133a, the charge generation layers 131b, 132b and 133b and the second stacks 131c, 132c and 133c are formed in due order after the trench portion TP is formed. The first stacks 131a, 132a and 133a, the charge generation layers 131b, 132b and 133b, and the second stacks 131c, 132c and 133c may be disconnected among the subpixels P1, P2 and P3 due to the step difference of the trench portion TP.

Also, as shown in FIG. 5, sidewalls 131d and 132d formed to face each other toward the light emitting layer 130 of an adjacent subpixel while being disconnected due to the step difference of the trench portion TP may be defined in the light emitting layer 130, and the sidewall 131d of the light emitting layer of the first subpixel P1 and the sidewall 132d of the light emitting layer of the second subpixel P2 may be formed to face each other. Also, upper surfaces 131e and 132e that may be defined by an upper surface of the light emitting layer 130 or upper surfaces of the second stacks 131c and 132c may be defined in the light emitting layer 130.

The insulating portion 150 may be formed to partially overlap the trench portion TP among the subpixels P1, P2 and P3, and may be provided to cover the sidewalls of the light emitting layer and at least a portion of the upper surface of the light emitting layer.

In detail, the insulating portion 150, as shown in FIGS. 3 and 5, may be formed to cover the sidewall 131d of the light emitting layer of the first subpixel P1 and the sidewall 132d of the light emitting layer of the second subpixel P2. In this way, the insulating portion that covers the sidewall 131d of the light emitting layer of the first subpixel P1 and the sidewall 132d of the light emitting layer of the second subpixel P2 may be a first insulating portion 151. Also, the insulating portion 150 may be formed to cover at least a portion of the upper surface 131e of the light emitting layer of the first subpixel P1 and the upper surface 132e of the light emitting layer of the second subpixel P2. In this way, the insulating portion that covers at least a portion of the upper surface 131e of the light emitting layer of the first subpixel P1 and the upper surface 132e of the light emitting layer of the second subpixel P2 may be a second insulating portion 153.

In the present disclosure, the insulating portion 150 may be provided in such a manner that the second insulating portion 153 is not provided if lateral leakage current may be reduced by the formation of the first insulating portion 151.

In the display device 100 according to the present disclosure, the light emitting layer 130 of the adjacent subpixels P1, P2 and P3 includes the insulating portion 150 that includes the first insulating portion 151 and the second insulating portion 153 to be electrically connected with each other, whereby a lateral leakage current that may occur in the adjacent subpixels P1, P2 and P3 may be minimized.

According to one example, the first insulating portion 151 may be formed to be smaller than or equal to the width W of the trench portion TP. Also, the second insulating portion 153 may be formed to be smaller than or equal to the width W of the trench portion TP, and may be set to be greater than the width W of the trench portion TP as shown in FIGS. 3 and 5.

The insulating portion 150 is formed to fill a space formed by the trench portion TP formed among the subpixels P1, P2 and P3 and the light emitting layer 130 formed subsequently to the trench portion TP. Therefore, the insulating portion 150 is arranged among the light emitting layers 130 respectively provided in the subpixels P1, P2 and P3 to insulate the light emitting layers 130 from one another. Particularly, in the display device 100 according to one aspect of the present disclosure, the insulating portion 150 is provided among the first stacks 131a, 132a and 133a, the charge generation layers 131b, 132b and 133b, and the second stacks 131c, 132c and 133c of each of the subpixels P1, P2 and P3 to insulate the first stacks 131a, 132a and 133a, the charge generation layers 131b, 132b and 133b, and the second stacks 131c, 132c and 133c from one another. Therefore, in the display device 100 according to one aspect of the present disclosure, a current may more stably be prevented from leaking among the adjacent subpixels P1, P2 and P3 through the first stacks 131a, 132a and 133a, the charge generation layers 131b, 132b and 133b, and the second stacks 131c, 132c and 133c. Also, the insulating portion 150 may be formed on the light emitting layer 130, and may be formed below the second electrode 140.

Also, an insulating material 157 may be prepared by an Atomic Layer Deposition (ALD) method. Since the insulating material 157 prepared by the ALD method has an excellent step coverage characteristic, even though an interval between the trench portion TP formed among the subpixels P1, P2 and P3 and the light emitting layer 130 is narrow, the insulating material 157 may be formed with a relatively constant thickness at a side of the light emitting layer overlapped with the trench portion TP. The insulating portion 150 may be formed of, but not limited to, an inorganic film, for example, AlOx, a silicon oxide (SiOx) film, a silicon nitride (SiNx) film, or a multi-layered film of AlOx, SiOx and SiNx. The insulating portion 150 may be prepared as AlOx.

The first stacks 131a, 132a and 133a respectively formed in the subpixels P1, P2 and P3 may form spaces among the subpixels P1, P2 and P3 while being spaced apart from one another. The charge generation layers 131b, 132b and 133b respectively formed in the subpixels P1, P2 and P3 may form spaces among the subpixels P1, P2 and P3 while being spaced apart from one another. Also, the second stacks 131c, 132c and 133c respectively formed in the subpixels P1, P2 and P3 may form spaces among the subpixels P1, P2 and P3 while being spaced apart from one another. The spaces formed by the first stacks 131a, 132a and 133a, the charge generation layers 131b, 132b and 133b and the second stacks 131c, 132c and 133c may be closed by the subsequent insulating portion 150, whereby a predetermined air gap AG may be provided.

The air gap AG may be formed to overlap the trench portion TP, and may be surrounded by the light emitting layer 130 and the insulating portion 150.

The air gap AG, as shown in FIG. 5, may have a height greater than a depth D of the trench portion TP in accordance with a formation condition of the light emitting layer 130 formed subsequently to the trench portion TP. However, as the insulating portion 150 is formed to be filled in the trench portion TP in accordance with a filling condition of the insulating portion 150 after the trench portion TP is formed, the air gap AG may be omitted.

The insulating portion according to one aspect of the present disclosure may include a first insulating portion 151 and a second insulating portion 153, and may have a shape such as 'T' based on a section cut among the subpixels P1, P2 and P3 or a shape of 'K' clockwise rotated at 90°

The second electrode 140 is formed on the light emitting layer 130 and the insulating portion 150. The second electrode 140 may be a common layer commonly formed by being connected among the subpixels P1, P2 and P3. The second electrode 140 is shown in FIG. 3 as a common layer commonly formed in the subpixels P1, P2 and P3 but is not limited to the common layer.

The second electrode 140 may be formed of a transparent metal material, a semi-transmissive metal material, or a metal material with high reflectivity. If the display device 100 is provided in a top emission type, the second electrode 140 may be formed of a transparent conductive material (TCO) such as ITO and IZO, which may transmit light, or a semi-transmissive conductive material such as Mg, Ag, or an alloy of Mg and Ag. If the display device 100 is provided in a bottom emission type, the second electrode 140 may be formed of a metal material with high reflectivity such as a deposited structure (Ti/Al/Ti) of Al and Ti, a deposited structure (ITO/Al/ITO) of Al and ITO, an Ag alloy, and a deposited structure (ITO/Ag alloy/ITO) of Ag alloy and ITO. The Ag alloy may be an alloy of Ag, Pd and Cu. The second electrode may be referred to as cathode electrodes.

The encapsulation portion 160 may be formed to cover the second electrode 140. The encapsulation portion 160 serves to prevent oxygen or water from being permeated into the light emitting layer 130, the second electrode 140 and the insulating portion 150. To this end, the encapsulation portion 160 may include at least one inorganic film and at least one organic film. In detail, the encapsulation portion 160 may include a first inorganic film and an organic film. In one aspect, the encapsulation portion 160 may further include a second inorganic film. The first inorganic film is formed to cover the second electrode 140. The organic film is formed on the first inorganic film. The organic film may be formed at a sufficient thickness to prevent particles from being permeated into the light emitting layer 130 and the second electrode 140 by passing through the first inorganic film. The second inorganic film is formed to cover the organic film.

Each of the first and second inorganic films may be formed of a silicon nitride, an aluminum nitride, a zirconium nitride, a titanium nitride, a hafnium nitride, a tantalum nitride, a silicon oxide, an aluminum oxide, or a titanium oxide. The first and second inorganic films may be deposited by, but not limited to, a Chemical Vapor Deposition (CVD) method or an Atomic Layer Deposition (ALD) method.

The organic film may be formed of acrylic resin, epoxy resin, phenolic resin, polyamide resin, or polyimide resin. The organic film may be formed by, but not limited to, a vapor deposition method, a printing method, and a slit coating method. The organic film may be formed by an ink-jet process.

The color filter 170 is formed on the encapsulation portion 160. The color filter 170 includes a first color filter CF1, a second color filter CF2 and a third color filter CF3, which are arranged to respectively correspond to the subpixels P1, P2 and P3. The first color filter CF1 may be a red color filter transmitting red light, the second color filter CF2 may be a green color filter transmitting green light, and the third color filter CF3 may be a blue color filter transmitting blue light.

FIGS. 6A to 6F are cross-sectional views illustrating a manufacturing method of a display device according to one aspect of the present disclosure.

First of all, the driving thin film transistor TFT and the passivation layer 115 are formed on the substrate 111. The passivation layer 115 may be formed of an inorganic film, for example, a silicon oxide (SiOx) film, a silicon nitride (SiNx) film, or a multi-layered film of SiOx and SiNx. The passivation layer 115 may be formed of an organic film such as acryl resin, epoxy resin, phenolic resin, polyamide resin, and polyimide resin. Alternatively, the passivation layer 115 may be formed of a multi-layered film that includes at least one inorganic film and at least one organic film.

Next, the first electrode 120 is formed on the passivation layer 115 and patterned for each of the subpixels P1, P2 and P3. The first electrode 120 is connected to the source terminal or the drain terminal of the driving thin film transistor TFT through a contact hole CH that passes through the passivation layer 115.

The first electrodes 121, 122 and 123 may be formed of a transparent metal material, a semi-transmissive metal material, or a metal material with high reflectivity. If the display device 100 is provided in a top emission type, the first electrodes 121, 122 and 123 may be formed of a metal material with high reflectivity such as a deposited structure (Ti/Al/Ti) of Al and Ti, a deposited structure (ITO/Al/ITO) of Al and ITO, an Ag alloy, and a deposited structure (ITO/Ag alloy/ITO) of Ag alloy and ITO. The Ag alloy may be an alloy of Ag, Pd and Cu. If the display device 100 is provided in a bottom emission type, the first electrodes 121, 122 and 123 may be formed of a transparent conductive material (TCO) such as ITO and IZO, which may transmit light, or a semi-transmissive conductive material such as Mg, Ag, or an alloy of Mg and Ag. In this case, the first electrodes 121, 122 and 123 may be referred to as anode electrodes.

Next, a bank material 127 constituting the bank 125 is deposited on the first electrode 120, and the bank 125 and the trench portion TP are formed to be patterned.

The trench portion TP is formed in the passivation layer 115 by performing an etching process. The trench portion TP may be formed among the subpixels P1, P2 and P3 by partially removing the passivation layer 115 to be recessed but is not limited to this example. The trench portion TP may be formed to pass through the passivation layer 115, or may be formed by removing at least a portion of the substrate 111. In this case, the trench portion TP may be referred to as an opening portion or hole.

Figure 6A:
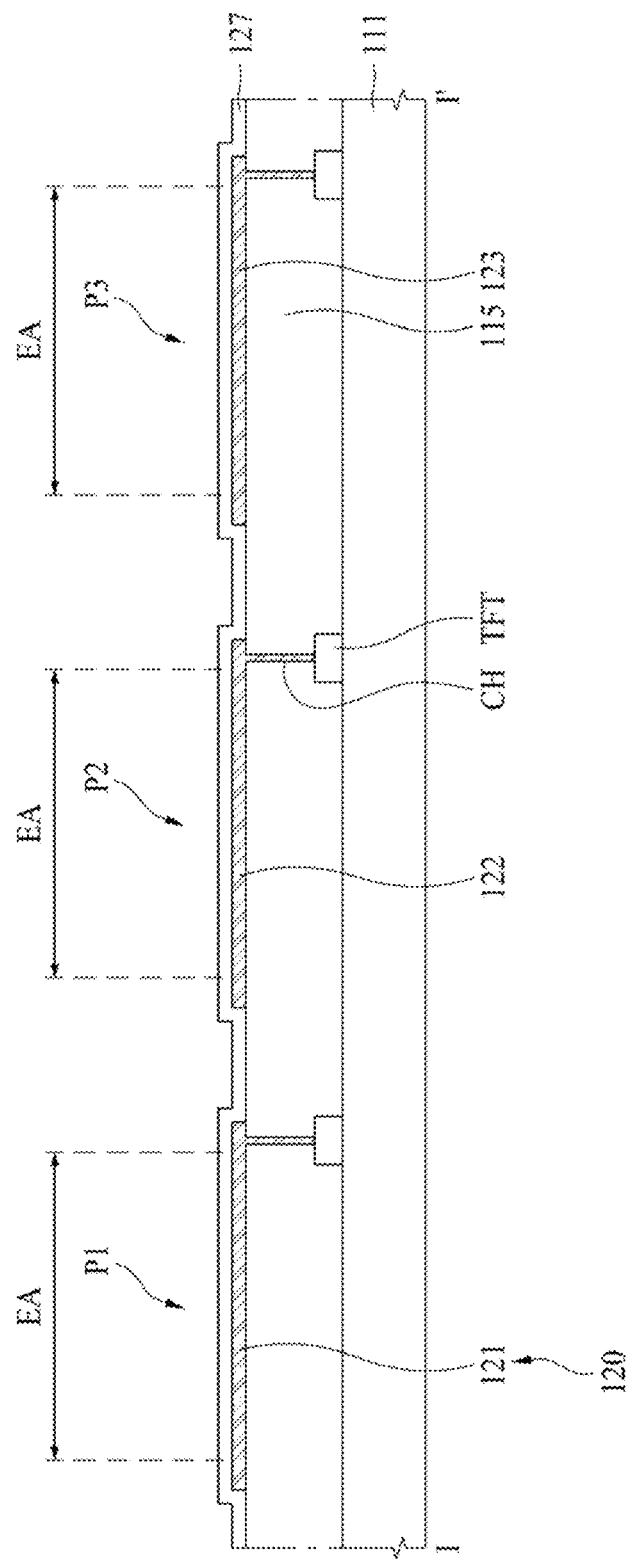
Figure 6B:
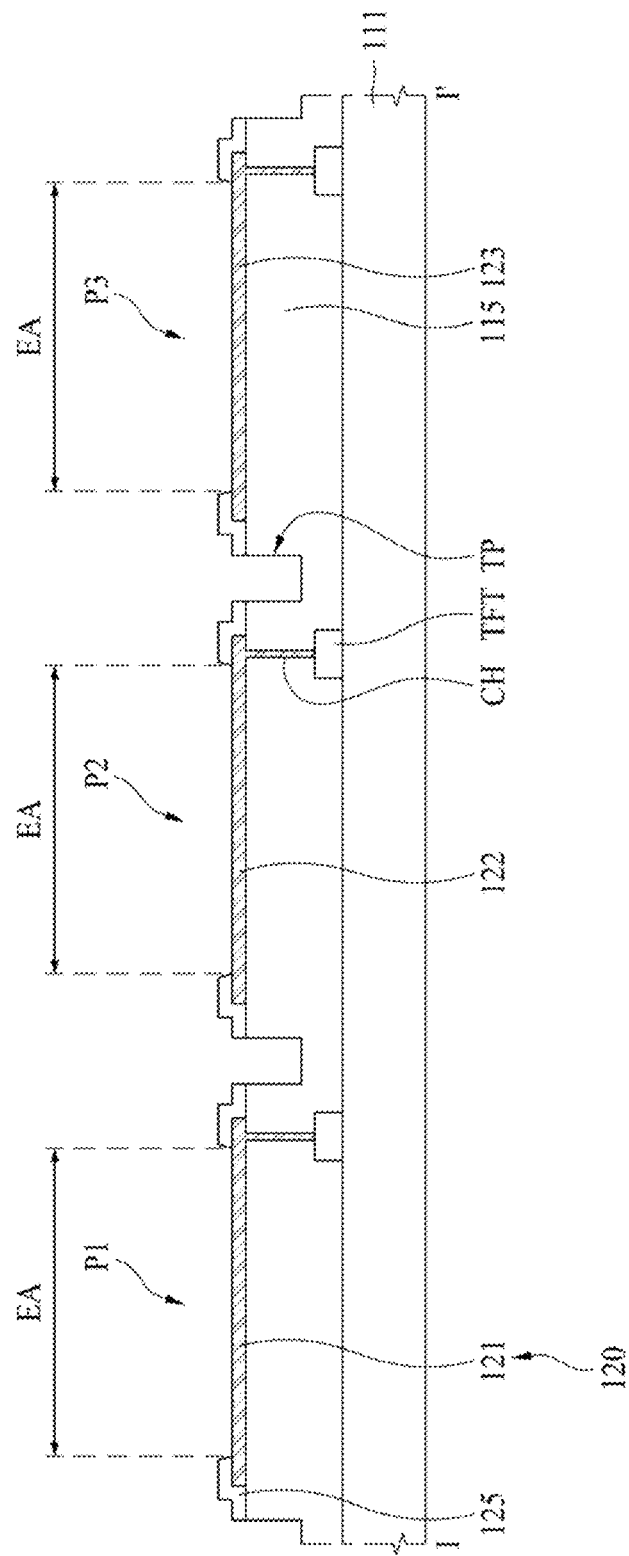

The trench portion TP is formed among the first, second and third subpixels P1, P2 and P3 emitting light of different colors. Also, as shown in FIG. 6B, the bank material 127 deposited on the first electrode 120 is partially removed to form the bank 125. As a result, the bank 125 is formed to cover ends of each of the first electrodes 121, 122 and 123 and expose the trench portion TP formed among the subpixels P1, P2 and P3.

The bank 125 may be formed of, but not limited to, an inorganic film, for example, a silicon oxide (SiOx) film, a silicon nitride (SiNx) film, or a multi-layered film of SiOx and SiNx. The bank 125 may be formed of an organic film such as acryl resin, epoxy resin, phenolic resin, polyamide resin, and polyimide resin.

Meanwhile, the trench portion TP is formed after the first electrode 120 is formed in FIG. 6B, but the trench portion TP is not limited to the example of FIG. 6B. In another aspect, the trench portion TP may be formed together with the contact hole CH that exposes the driving thin film transistor TFT by passing through the passivation layer 115. Also, the trench portion TP is formed after the bank material 127 is deposited in FIGS. 6A and 6B, but the trench portion TP is not limited to the example of FIGS. 6A and 6B. In another aspect, the trench portion TP may be formed before the bank material 127 is deposited. In this case, after the trench portion TP is formed, the bank material 127 is deposited on the trench portion TP, the first electrode 120 and the passivation layer 115. Then, the bank material 127 deposited on the first electrode 120 may partially be removed to form the bank 125.

Next, the light emitting layer 130 is formed.

Figure 6C:
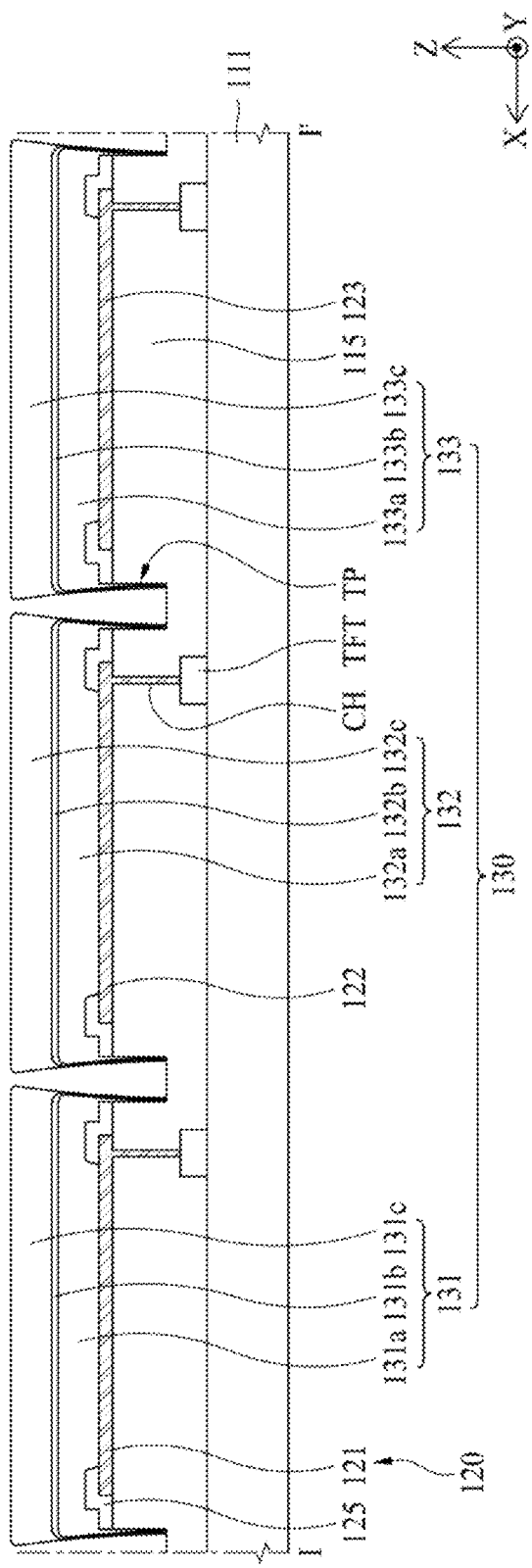
Figure 6D:
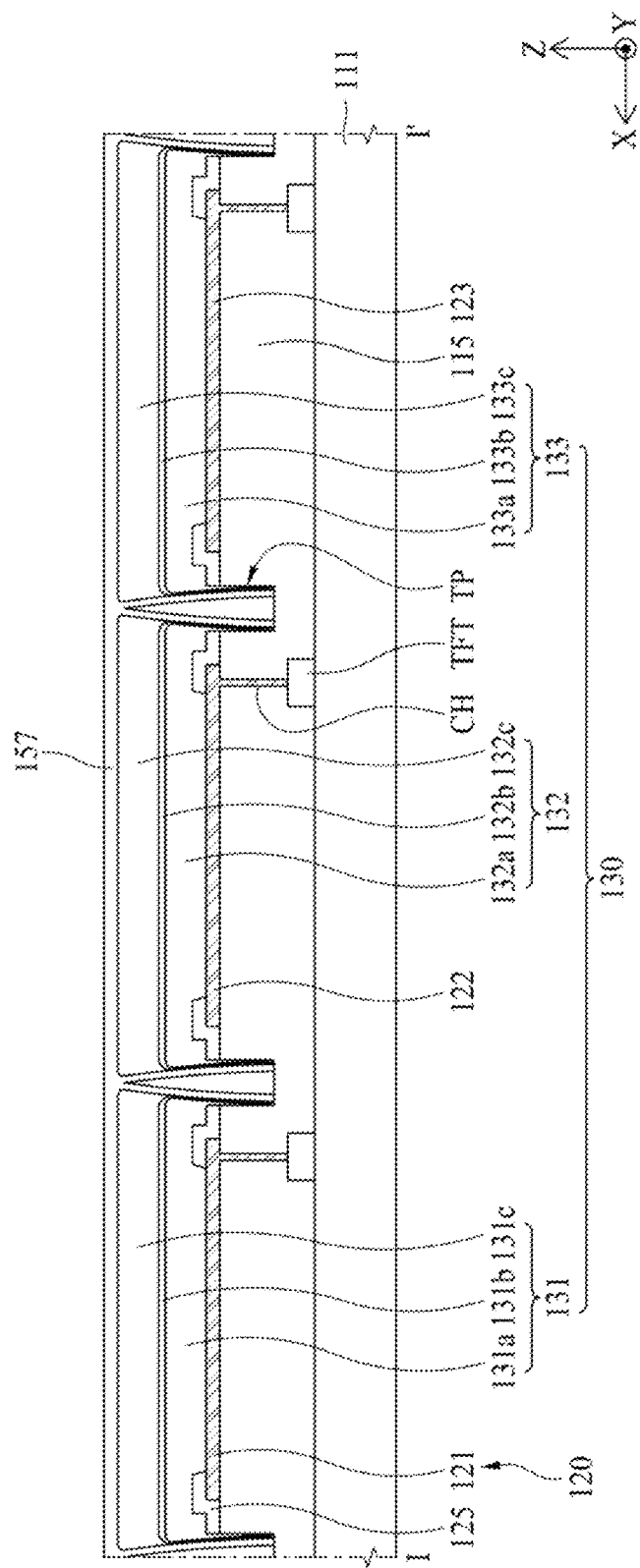

In more detail, as shown in FIG. 6C, the first stacks 131a, 132a and 133a, the charge generation layers 131b, 132b and 133b and the second stacks 131c, 132c and 133c are formed on the first electrodes 121, 122 and 123 in due order.

First of all, the first stacks 131a, 132a and 133a are formed on the first electrodes 121, 122 and 123. The first stacks 131a, 132a and 133a may be formed by a deposition process or a solution process. If the first stacks 131a, 132a and 133a are formed by a deposition process, the first stacks 131a, 132a and 133a may be formed using an evaporation method. The first stacks 131a, 132a and 133a are disconnected among the subpixels P1, P2 and P3.

The first stacks 131a, 132a and 133a may include a deposited structure of a hole injecting layer HIL, a hole transporting layer HTL, a first light emitting layer EML1 emitting light of a first color, and an electron transporting layer ETL, which are deposited in due order.

The first light emitting layer EML1 may be, but not limited to, at least one of a red light emitting layer emitting red light, a green light emitting layer emitting green light, a blue light emitting layer emitting blue light, and a yellow light emitting layer emitting yellow light.

Then, the charge generation layers 131b, 132b and 133b are formed on the first stacks 131a, 132a and 133a. The charge generation layers 131b, 132b and 133b are disconnected among the subpixels P1, P2 and P3.

Then, the second stacks 131c, 132c and 133c are formed on the charge generation layers 131b, 132b and 133b. The second stacks 131c, 132c and 133c may be formed by a deposition process or a solution process. If the second stacks 131c, 132c and 133c are formed by a deposition process, the second stacks 131c, 132c and 133c may be formed using an evaporation method. The second stacks 131c, 132c and 133c are disconnected among the subpixels P1, P2 and P3.

The second stacks 131c, 132c and 133c may include a deposited structure of a hole transporting layer HTL, a second light emitting layer EML2 emitting light of a second color, a hole transporting layer ETL, and a hole injecting layer HIL, which are deposited in due order. The second light emitting layer EML2 may be, but not limited to, at least one of a red light emitting layer emitting red light, a green light emitting layer emitting green light, a blue light emitting layer emitting blue light, and a yellow light emitting layer emitting yellow light.

However, the second light emitting layer EML2 may emit light of a color different from that of light emitted from the first light emitting layer EML1. For example, the first light emitting layer EML1 may be a blue light emitting layer emitting blue light, and the second light emitting layer EML2 may be a yellow light emitting layer emitting yellow light. For another example, the first light emitting layer EML1 may be a blue light emitting layer emitting blue light, and the second light emitting layer EML2 may be a red light emitting layer emitting red light and a green light emitting layer emitting green light.

Next, the insulating portion 150 is formed.

The insulating portion 150 may be formed by depositing and then patterning the insulating material 157. The insulating portion 150 is formed to fill a space formed by the trench portion TP formed among the subpixels P1, P2 and P3 and the light emitting layer 130 formed subsequently to the trench portion TP. Therefore, the insulating portion 150 is arranged among the light emitting layers 130 respectively provided in the subpixels P1, P2 and P3 to insulate the light emitting layers 130 from one another.

In detail, the insulating portion 150 may be formed to cover the sidewall 131d of the light emitting layer of the first subpixel P1 and the sidewall 132d of the light emitting layer of the second subpixel P2. In this way, the insulating portion that covers the sidewall 131d of the light emitting layer of the first subpixel P1 and the sidewall 132d of the light emitting layer of the second subpixel P2 may be a first insulating portion 151. Also, the insulating portion 150 may be formed to cover at least a portion of the upper surface 131e of the light emitting layer of the first subpixel P1 and the upper surface 132e of the light emitting layer of the second subpixel P2. In this way, the insulating portion that covers at least a portion of the upper surface 131e of the light emitting layer of the first subpixel P1 and the upper surface 132e of the light emitting layer of the second subpixel P2 may be a second insulating portion 153. The first insulating portion 151 and the second insulating portion 153 may be formed to be connected with each other.

Also, the insulating material 157 may be prepared by an Atomic Layer Deposition (ALD) method. Since the insulating material 157 prepared by the ALD method has an excellent step coverage characteristic, even though an interval between the trench portion TP formed among the subpixels P1, P2 and P3 and the light emitting layer 130 is narrow, the insulating material 157 may be formed with a relatively constant thickness at a side of the light emitting layer overlapped with the trench portion TP. The insulating material 157 may be formed of, but not limited to, an inorganic film, for example, a silicon oxide (SiOx) film, a silicon nitride (SiNx) film, or a multi-layered film of SiOx and SiNx.

Then, the second electrode 140 is formed.

Figure 6F:
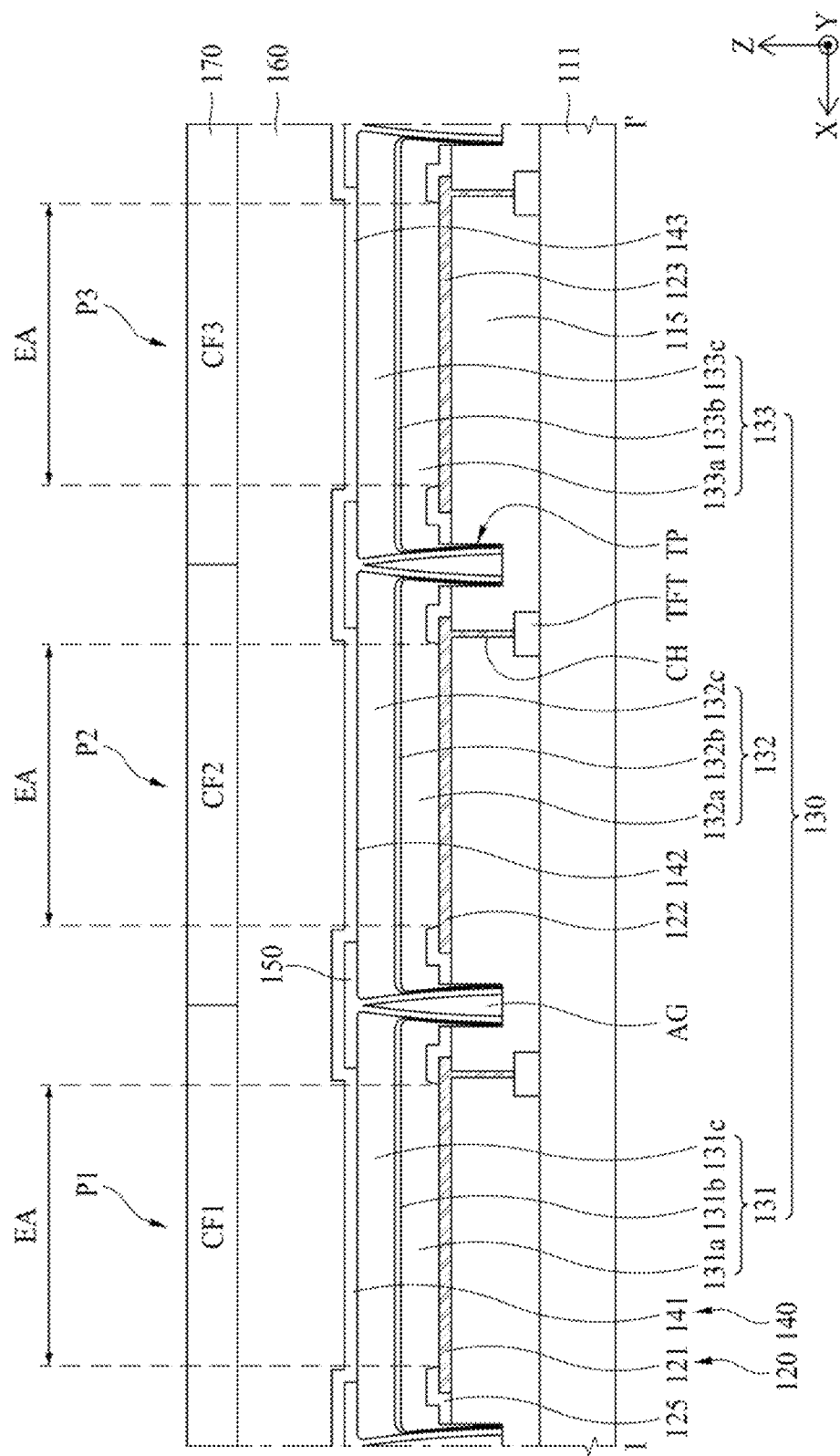

In more detail, as shown in FIG. 6F, the second electrodes 141, 142 and 143 are formed on the light emitting layers 131, 132 and 133 and the insulating portion 150.

The second electrodes 141, 142 and 143 may be formed of a transparent metal material, a semi-transmissive metal material, or a metal material with high reflectivity. If the display device 100 is provided in a top emission type, the second electrodes 141, 142 and 143 may be formed of a transparent conductive material (TCO) such as ITO and IZO, which may transmit light, or a semi-transmissive conductive material such as Mg, Ag, or an alloy of Mg and Ag. If the display device 100 is provided in a bottom emission type, the second electrodes 141, 142 and 143 may be formed of a metal material with high reflectivity such as a deposited structure (Ti/Al/Ti) of Al and Ti, a deposited structure (ITO/Al/ITO) of Al and ITO, an Ag alloy, and a deposited structure (ITO/Ag alloy/ITO) of Ag alloy and ITO. The Ag alloy may be an alloy of Ag, Pd and Cu. The second electrodes 141, 142 and 143 may be cathode electrodes.

Next, the encapsulation portion 160 is formed.

In more detail, the encapsulation portion 160 is formed on the second electrode 140. The encapsulation portion 160 may include a first inorganic film and an organic film. In one aspect, the encapsulation portion 160 may further include a second inorganic film.

The first inorganic film is formed on the second electrode 140. Then, the organic film is formed on the first inorganic film. The organic film may be formed at a sufficient thickness to prevent particles from being permeated into the light emitting layer 130 and the second electrode 140 by passing through the first inorganic film. Then, the second inorganic film is formed on the organic film.

Each of the first and second inorganic films may be formed of a silicon nitride, an aluminum nitride, a zirconium nitride, a titanium nitride, a hafnium nitride, a tantalum nitride, a silicon oxide, an aluminum oxide, or a titanium oxide. The first and second inorganic films may be deposited by, but not limited to, a Chemical Vapor Deposition (CVD) method or an Atomic Layer Deposition (ALD) method.

The organic film may be formed of acrylic resin, epoxy resin, phenolic resin, polyamide resin, or polyimide resin. The organic film may be formed by, but not limited to, a vapor deposition method, a printing method, and a slit coating method. The organic film may be formed by an ink-jet process.

Next, the color filter 170 is formed.

In more detail, the color filter 170 is formed on the encapsulation portion 160. The color filter 170 may include a first color filter CF1 arranged to correspond to the first subpixel P1, a second color filter CF2 arranged to correspond to the second subpixel P2, and a third color filter CF3 arranged to correspond to the third subpixel P3. The first color filter CF1 may be a red color filter transmitting red light, the second color filter CF2 may be a green color filter transmitting green light, and the third color filter CF3 may be a blue color filter transmitting blue light.

Figure 7:
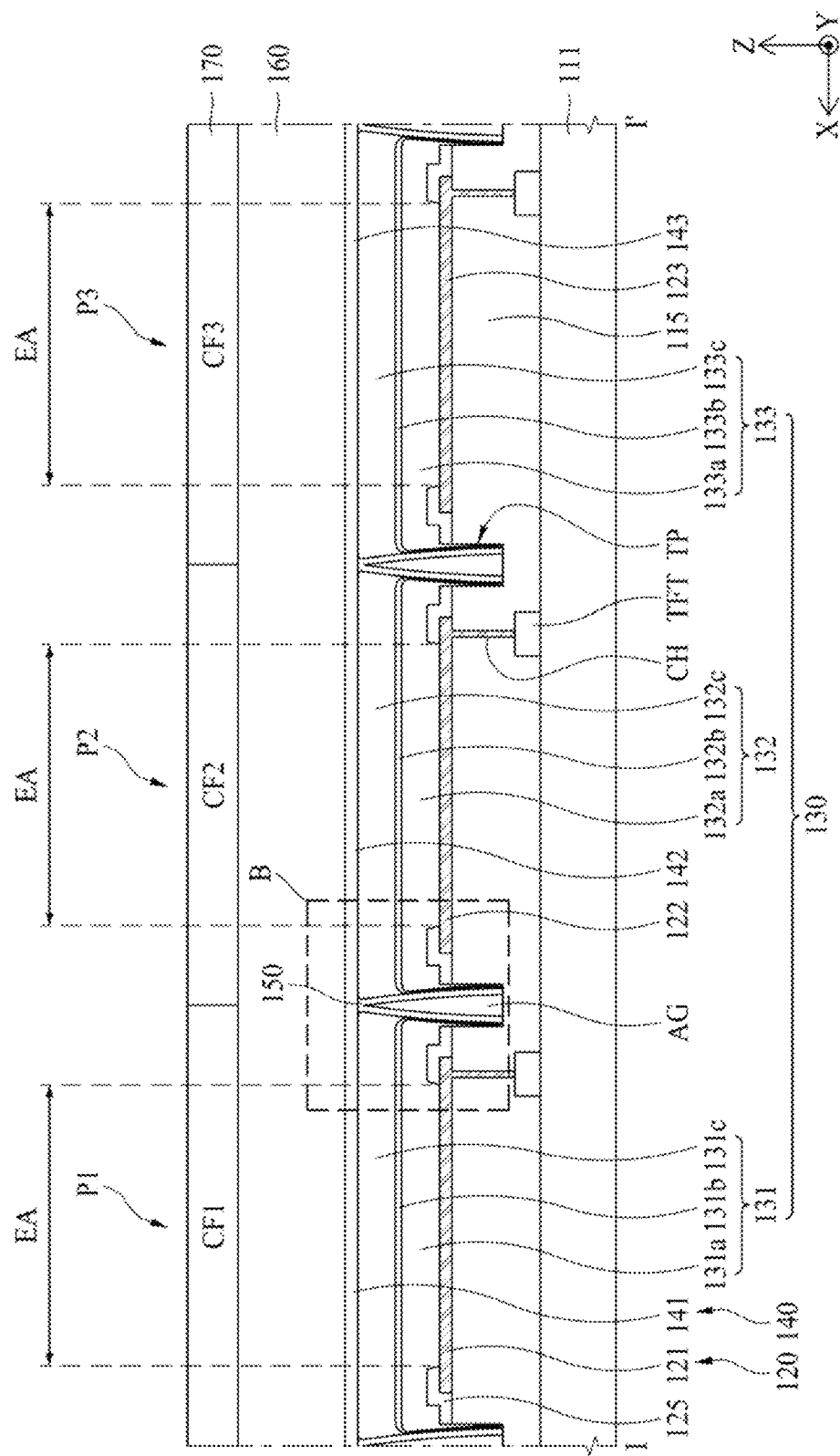
FIG. 7 is a cross-sectional view illustrating another example taken along line I-I' of FIG. 2.
Figure 8:
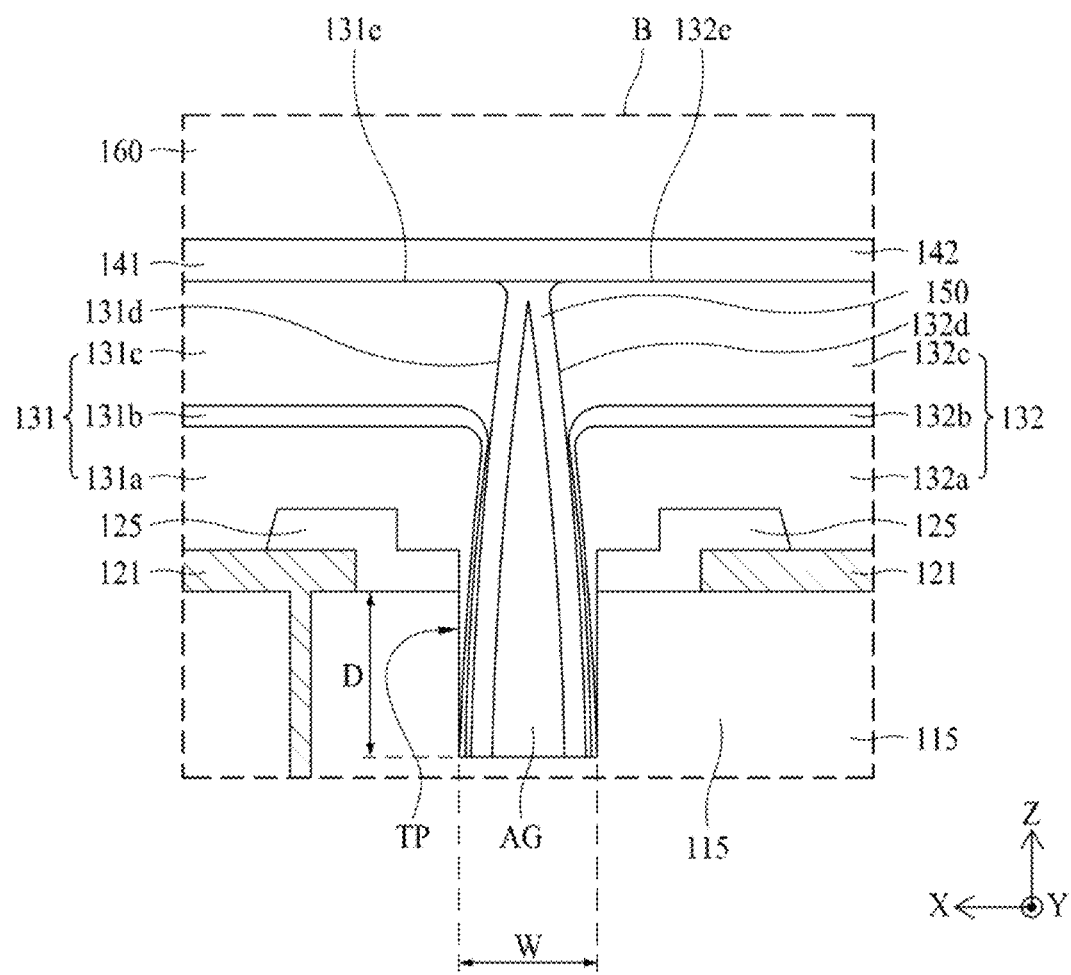
FIG. 8 is an enlarged view illustrating area B of FIG. 7.

FIG. 7 is a cross-sectional view illustrating another example taken along line I-I' of FIG. 2, and FIG. 8 is an enlarged view illustrating an area B of FIG. 7. Since the display device of FIGS. 7 and 8 is the same as the display device of FIGS. 1 to 6 except that the insulating portion 150 includes only the first insulating portion 151 without including both the first insulating portion 151 and the second insulating portion 153, its repeated description will be omitted.

Referring to FIGS. 7 and 8, the insulating portion 150 that may insulate the light emitting layers 131, 132 and 133 of the subpixels P1, P2 and P3 adjacent to one another may include only the first insulating portion 151. The display device 100 according to the present disclosure comprises the insulating portion 150 that includes the first insulating portion 151 electrically insulates the light emitting layers 130 of the subpixels P1, P2 and P3 from one another, whereby a lateral leakage current that may occur among the adjacent subpixels P1, P2 and P3 may be minimized.

Figure 9A:
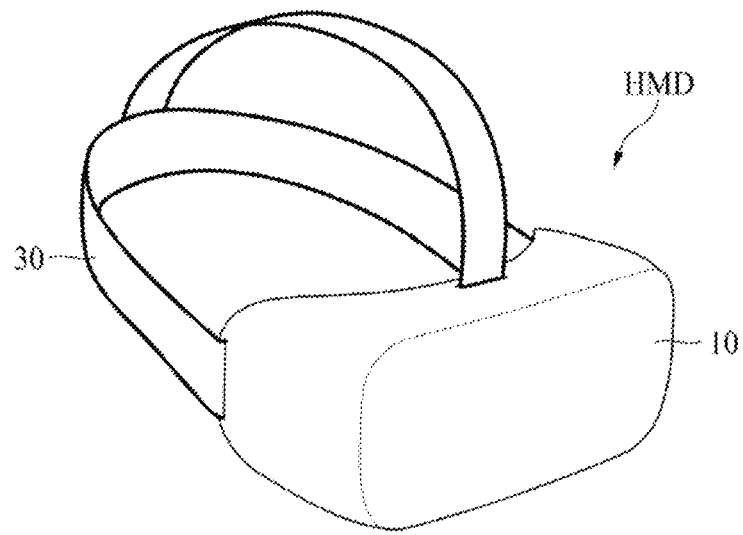
FIGS. 9A to 9C are views illustrating a display device according to another aspect of the present disclosure, and relate to a head-mounted display (HMD) device.
Figure 9B:
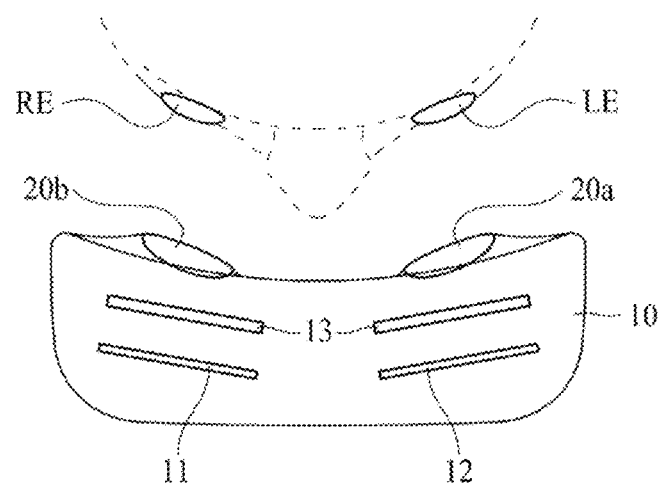
Figure 9C:
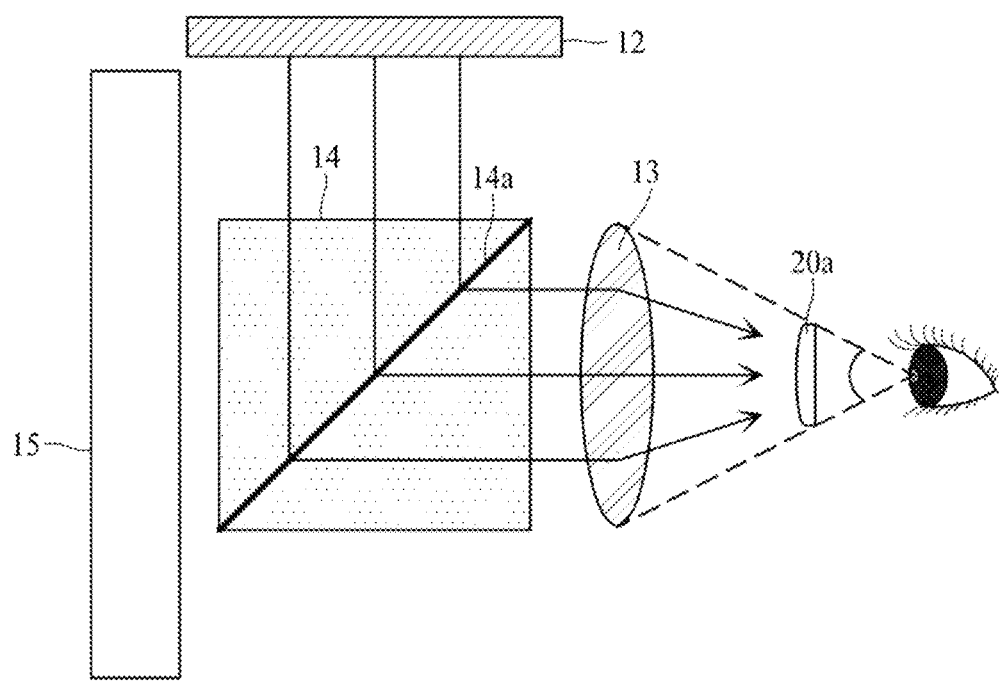

FIGS. 9A to 9C are views illustrating a display device according to another aspect of the present disclosure, and relate to a head-mounted display (HMD) device. FIG. 9A is brief perspective view, FIG. 9B is a brief plane view of a virtual reality (VR) structure, and FIG. 9C is a brief cross-sectional view of an augmented reality (AR) structure.

As will be aware of it from FIG. 9A, a head mounted display device according to the present disclosure comprises a storage case 10, and a head mounted band 30.

The storage case 10 stores the display device, a lens array and an ocular lens therein.

The head mounted band 30 is fixed to the storage case 10. The head mounted band 30 is formed to surround a top surface and both sides of a user's head, but is not limited to this example. The head mounted band 30 is to fix a head mounted display to a user's head and may be replaced with a structure formed in a shape of a glasses frame or a helmet shape.

As will be aware of it from FIG. 9B, a head mounted display device of a virtual reality (VR) structure according to the present disclosure includes a left eye display device 12, a right eye display device 11, a lens array 13, a left eye ocular lens 20a, and a right eye ocular lens 20b.

The left eye display device 12, the right eye display device 11, the lens array 13, the left eye ocular lens 20a, and the right eye ocular lens 20b are stored in the storage case 10, as mentioned above.

The left eye display device 12 and the right eye display device 11 may display the same image, and in this case, a user may view 2D image. Alternatively, the left eye display device 12 may display a left eye image and the right eye display device 11 may display a right eye image, and in this case, a user may view a 3D image. Each of the left eye display device 12 and the right eye display device 11 may be comprised of a display device according to FIGS. 1 to 8, as described above. In this case, an upper portion corresponding to a surface where an image is displayed in FIGS. 1 to 8, for example, a color filter 170 faces the lens array 13.

The lens array 13 may be provided between the left eye ocular lens 20a and the left eye display device 12 by being spaced apart from each of the left eye ocular lens 20a and the left eye display device 12. That is, the lens array 13 may be arranged in front of the left eye ocular lens 20a and behind the left eye display device 12. Also, the lens array 13 may be provided between the right eye ocular lens 20b and the right eye display device 11 by being spaced apart from each of the right eye ocular lens 20b and the right eye display device 11. That is, the lens array 13 may be arranged in front of the right eye ocular lens 20b and behind the right eye display device 11.

The lens array 13 may be a micro lens array. The lens array 13 may be replaced with a pin hole array. Due to the lens array 13, an image displayed on the left eye display device 12 or the right eye display device 11 may be viewed to be magnified to a user.

A left eye LE of a user may be arranged in the left eye ocular lens 20a, and a right eye RE of a user may be arranged in the right eye ocular lens 20b.

As will be aware of it from FIG. 9C, a head mounted display device of an AR structure according to the present disclosure includes a left eye display device 12, a lens array 13, a left eye ocular lens 20a, a transmissive reflection portion 14, and a transmissive window 15. Although only a structure for a left eye is shown in FIG. 9C for convenience, a structure for a right eye is the same as the structure for the left eye.

The left eye display device 12, the lens array 13, the left eye ocular lens 20a, the transmissive reflection portion 14, and the transmissive window 15 are stored in the storage case 10, as mentioned above.

The left eye display device 12 may be arranged at one side of the transmissive reflection portion 14, for example, at an upper side, without covering the transmissive window 15. Therefore, the left eye display device 12 may provide the transmissive reflection portion 14 with an image without covering an outer background viewed through the transmissive window 15.

The left eye display device 12 may be comprised of the display device according to FIGS. 1 to 8 described above. In this case, the top portion corresponding to the surface where images are displayed in FIGS. 1 to 8, for example, the color filter 170 faces the transmissive reflection portion 14.

The lens array 13 may be provided between the left eye ocular lens 20a and the transmissive reflection portion 14.

A left eye of a user is arranged in the left eye ocular lens 20a.

The transmissive reflection portion 14 is arranged between the lens array 13 and the transmissive window 15. The transmissive reflection portion 14 may include a reflective surface 14a which transmits a portion of light and reflects another portion of light. The reflective surface 14a is formed to make an image displayed on the left eye display device 12 to proceed to the lens array 13. Therefore, a user may view all of images displayed on the left eye display device 12 and an outer background through the transmissive window 15. That is, since the user may view one image by overlapping background in reality with virtual images, augmented reality (AR) may be embodied.

The transmissive window 15 is arranged in front of the transmissive reflection portion 14.

The display device according to one aspect of the present disclosure may be described as follows.

The display device according to one aspect of the present disclosure comprises a substrate in which a first subpixel and a second subpixel arranged to adjoin the first subpixel are defined, a first electrode provided in each of the first subpixel and the second subpixel on the substrate, a light emitting layer provided in each of the first subpixel and the second subpixel on the first electrode, a second electrode commonly provided in the first subpixel and the second subpixel on the light emitting layer, a trench portion provided between the first subpixel and the second subpixel, and an insulating portion filling at least a portion of the trench portion.

According to some aspects of the present disclosure, the light emitting layer may include a first stack formed on the first electrode, a second stack provided on the first stack, and a charge generation layer provided between the first stack and the second stack.

According to some aspects of the present disclosure, the display device may further comprise a passivation layer formed on the substrate, wherein the trench portion may be formed by partially removing the passivation layer.

According to some aspects of the present disclosure, the trench portion may be formed by additionally removing the substrate.

According to some aspects of the present disclosure, the light emitting layer may include a first stack including a first light emitting layer, a second stack including a second light emitting layer, and a charge generation layer arranged between the first stack and the second stack.

According to some aspects of the present disclosure, the light emitting layer provided in the first subpixel and the light emitting layer provided in the second subpixel include sidewalls formed to face each other.

According to some aspects of the present disclosure, the insulating portion may include a first insulating portion arranged to cover the sidewalls of the light emitting layers.

According to some aspects of the present disclosure, the insulating portion may include a second insulating portion formed to be extended from the first insulating portion and formed to overlap at least a portion of an upper surface of the light emitting layer.

According to some aspects of the present disclosure, the second insulating portion may be formed to overlap the trench portion.

According to some aspects of the present disclosure, the display device may further comprise an air gap surrounded by the trench portion and the insulating portion.

According to some aspects of the present disclosure, further comprising a bank formed on the passivation layer and formed to partially overlap the first electrode.

According to some aspects of the present disclosure, the display device may further comprise a driving thin film transistor formed on the substrate and electrically connected with each of the first electrodes of the first subpixel and the second subpixel.

It will be apparent to those skilled in the art that the present disclosure described above is not limited by the above-described aspects and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

Note: essential matter cannot be incorporated by reference from foreign patents, foreign patent application or non-patent publications; however the U.S. PTO should allow the improperly incorporated subject matter to be expressly added to the specification by way of amendment without affecting the filing date. The ability to incorporate by reference to the ADS is untested. We strongly encourage you to explicitly list those references you wish to incorporate by reference at the appropriate location within the sentence.

These and other changes can be made to the aspects in light of the above-detailed description. In general, in the following claims, the terms used should not be construed to limit the claims to the specific aspects disclosed in the specification and the claims, but should be construed to include all possible aspects along with the full scope of equivalents to which such claims are entitled. Accordingly, the claims are not limited by the disclosure.

What is claimed is:

1. A display device comprising:
    a substrate in which a first subpixel and a second subpixel adjacent to the first subpixel are defined;
    a first electrode provided in each of the first subpixel and the second subpixel on the substrate;
    a light emitting layer provided in each of the first subpixel and the second subpixel on the first electrode;
    a second electrode commonly provided in the first subpixel and the second subpixel on the light emitting layer;
    a bank provided to cover ends of the first electrode;
    a trench portion provided between the first subpixel and the second subpixel; and
    an insulating portion filling at least a portion of the trench portion,
    wherein the light emitting layer covers the bank and fills at least a portion of the trench portion, and
    wherein the insulating portion contacts at least a part of an upper surface of the light emitting layer.

2. The display device of claim 1, wherein the light emitting layer of the first subpixel and the light emitting layer of the second subpixel do not contact with each other.

3. The display device of claim 1, further comprising a passivation layer formed on the substrate, wherein a first part of the trench portion is disposed in the passivation layer.

4. The display device of claim 3, wherein the trench portion has a second part disposed in the substrate.

5. The display device of claim 1, wherein the light emitting layer provided in the first subpixel and the light emitting layer provided in the second subpixel include sidewalls formed in an area overlapping with the trench portion to face each other.

6. The display device of claim 5, wherein the insulating portion includes a first insulating portion arranged to cover the sidewalls of the light emitting layer.

7. The display device of claim 6, wherein the insulating portion includes a second insulating portion extended from the first insulating portion and overlapping with at least a part of an upper surface of the light emitting layer.

8. The display device of claim 7, wherein the second insulating portion partially overlaps with the first electrode.

9. The display device of claim 5, wherein the insulating portion includes:
    a first insulating portion arranged to cover the sidewalls of the light emitting layers; and
    a second insulating portion formed to be extended from the first insulating portion and formed to overlap at least a part of an upper surface of the light emitting layer,
    wherein the insulating portion has a shape such as 'T' based on a section cut between the first subpixel P1 and second subpixel P2 or a shape of 'K' clockwise rotated at 90°.

10. The display device of claim 9, wherein the second insulating portion is formed to overlap with the trench portion.

11. The display device of claim 1, further comprising a driving thin film transistor formed on the substrate and electrically connected with each of the first electrodes of the first subpixel and the second subpixel.

12. The display device of 1, further comprising a lens array spaced apart from the substrate, and a storage case for storing the substrate and the lens array.

13. A display device comprising:
- a substrate in which a first subpixel and a second subpixel adjacent to the first subpixel are defined;
- a first electrode provided in each of the first subpixel and the second subpixel on the substrate;
- a light emitting layer provided in each of the first subpixel and the second subpixel on the first electrode, and the light emitting layer in the first subpixel and the light emitting layer in the second subpixel are separated apart from with each other;
- a second electrode commonly provided in the first subpixel and the second subpixel on the light emitting layer;
- a passivation layer disposed on the substrate;
- a bank provided to cover ends of the first electrode;
- a trench portion provided between the first subpixel and the second subpixel and including a first part disposed in the passivation layer and a second part disposed in the substrate;
- a first insulating portion covering sidewalls of the light emitting layer; and
- a second insulating portion extended from the first insulating portion and overlapping with at least a part of an upper surface of the light emitting layer,
- wherein the light emitting layer covers the bank and fills at least a portion of the trench portion.

14. The display device of claim 13, wherein the second insulating portion overlaps with the trench portion.

15. The display device of claim 13, further comprising a driving thin film transistor formed on the substrate and electrically connected with each of the first electrodes of the first subpixel and the second subpixel.

16. The display device of 13, further comprising a lens array spaced apart from the substrate, and a storage case for storing the substrate and the lens array.

17. The display device of claim 1, the trench portion provided between the first electrode of the first subpixel and the first electrode of the second subpixel, and spaced apart from the first electrodes.

* * * * *